United States Patent
Lupu et al.

(10) Patent No.: US 9,091,727 B1
(45) Date of Patent: *Jul. 28, 2015

(54) CONFIGURATION AND TESTING OF MULTIPLE-DIE INTEGRATED CIRCUITS

(71) Applicant: Xilinx, Inc., San Jose, CA (US)

(72) Inventors: Julian Lupu, Portland, OR (US); Shivani C. Desai, San Jose, CA (US); Lee N. Chung, San Jose, CA (US); Teymour M. Mansour, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 282 days.

This patent is subject to a terminal disclaimer.

(21) Appl. No.: 13/652,874

(22) Filed: Oct. 16, 2012

(51) Int. Cl.
  *G01R 31/28* (2006.01)
  *H01L 25/00* (2006.01)
  *G01R 31/3185* (2006.01)

(52) U.S. Cl.
  CPC ..... *G01R 31/318513* (2013.01); *H01L 2924/00* (2013.01)

(58) Field of Classification Search
  None
  See application file for complete search history.

(56) References Cited

U.S. PATENT DOCUMENTS

| | | | |
|---|---|---|---|
| 5,081,678 A | 1/1992 | Kaufman et al. | |
| 5,640,106 A * | 6/1997 | Erickson et al. | 326/38 |
| 6,212,639 B1 | 4/2001 | Erickson et al. | |
| 6,563,340 B1 | 5/2003 | Jones | |
| 6,614,259 B2 | 9/2003 | Couts-Martin et al. | |
| 6,654,889 B1 | 11/2003 | Trimberger | |
| 6,730,540 B2 | 5/2004 | Siniaguine | |
| 6,957,340 B1 | 10/2005 | Pang et al. | |
| 7,095,253 B1 | 8/2006 | Young | |
| 7,397,272 B1 * | 7/2008 | Wennekamp | 326/38 |
| 7,574,637 B2 * | 8/2009 | Ricchetti et al. | 714/724 |
| 7,671,624 B1 | 3/2010 | Walstrum, Jr. | |
| 7,702,893 B1 | 4/2010 | Rally et al. | |
| 7,710,146 B1 * | 5/2010 | Egner et al. | 326/38 |
| 7,827,336 B2 | 11/2010 | Miller et al. | |
| 7,971,072 B1 | 6/2011 | Donlin et al. | |
| 8,058,897 B1 * | 11/2011 | Lu et al. | 326/38 |
| 8,296,578 B1 | 10/2012 | New | |
| 8,327,201 B1 * | 12/2012 | Lai | 714/725 |
| 8,384,427 B1 * | 2/2013 | Tang et al. | 326/39 |
| 8,536,895 B2 * | 9/2013 | Lu et al. | 326/38 |

(Continued)

OTHER PUBLICATIONS

Oh, Boon Howe, et al., "The Evolution of CPU Packaging Technology and Future Challenges", Proceedings of the 2006 International Conference on Electronic Materials and Packaging, EMAP 2006, Dec. 11-14, 2006, pp. 1-6, IEEE.

(Continued)

*Primary Examiner* — Justin R Knapp
(74) *Attorney, Agent, or Firm* — LeRoy D. Maunu

(57) ABSTRACT

In one embodiment, a configuration data sequence is input to a master programmable integrated circuit (IC). In response to control bits in the configuration data sequence, the master programmable IC transmits the configuration data sequence to one or more slave programmable ICs. The master programmable IC and the one or more slave programmable ICs are configured in parallel with configuration bits from the configuration data sequence.

19 Claims, 5 Drawing Sheets

(56) References Cited

U.S. PATENT DOCUMENTS

| | | |
|---|---|---|
| 2003/0160633 A1 | 8/2003 | Terrill et al. |
| 2004/0080341 A1 | 4/2004 | Sasaki et al. |
| 2004/0178819 A1 | 9/2004 | New |
| 2006/0047953 A1 | 3/2006 | Beukema et al. |
| 2006/0076690 A1 | 4/2006 | Khandros et al. |
| 2006/0216866 A1 | 9/2006 | Lam et al. |
| 2007/0088993 A1* | 4/2007 | Baker .................... 714/718 |
| 2007/0195951 A1 | 8/2007 | Leung, Jr. |
| 2009/0160482 A1 | 6/2009 | Karp et al. |
| 2009/0161401 A1 | 6/2009 | Bilger et al. |
| 2010/0153747 A1 | 6/2010 | Asnaashari et al. |
| 2010/0157854 A1 | 6/2010 | Anderson et al. |
| 2011/0073996 A1 | 3/2011 | Leung et al. |
| 2012/0213185 A1 | 8/2012 | Frid |
| 2012/0324305 A1* | 12/2012 | Whetsel .................... 714/733 |
| 2013/0009694 A1 | 1/2013 | Camarota |

OTHER PUBLICATIONS

Xilinx, Inc., Alfke, Peter, Application Note, XAPP 052, Jul. 7, 1996, Version 1.1, "Efficient Shift Registers, LFSR Counters, and Long Pseudo Random Sequence Generators", pp. 1-6, Xilinx, Inc. 2100 Logic Drive, San Jose, CA 95124 US.

Xilinx, Inc., "Virtex-6 FPGA Configuration User Guide", UG360 (v2.0), Nov. 15, 2009, pp. 145-156, Chapter 10, www.xilinx.com, Xilinx, Inc., 2100 Logic Drive, San Jose, CA 95124 US.

U.S. Appl. No. 13/251,171, filed Sep. 30, 2011, Weiguang Lu et al., Xilinx, Inc. 2100 Logic Drive, San Jose, CA 95124 US.

U.S. Appl. No. 12/825,286, filed Jun. 28, 2010, Weiguang Lu et al., Xilinx, Inc. 2100 Logic Drive, San Jose, CA 95124 US.

U.S. Appl. No. 12/820,591, filed Jun. 22, 2010, Weiguang Lu et al., Xilinx, Inc. 2100 Logic Drive, San Jose, CA 95124 US.

* cited by examiner

CONFIGURATION AND TESTING OF MULTIPLE-DIE INTEGRATED CIRCUITS

FIELD OF THE INVENTION

An embodiment relates to testing an integrated circuit (IC) that includes multiple dies.

BACKGROUND

Programmable integrated circuits (ICs) include a plurality of resources that can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and bus or network interfaces such as Peripheral Component Interconnect Express (PCIe) and Ethernet and so forth.

Each programmable tile may include both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

SUMMARY

In one embodiment, a method is provided for configuration of a plurality of programmable ICs. A configuration data sequence is input to a master programmable IC. In response to control bits in the configuration data sequence, the master programmable IC transmits the configuration data sequence to one or more slave programmable ICs. The master programmable IC and the one or more slave programmable ICs are configured in parallel with configuration bits from the configuration data sequence.

In another embodiment, a circuit is provided. The circuit includes an interposer having a substrate, a plurality of through-silicon-vias (TSVs), and a routing layer that includes routing circuitry coupled to the TSVs. The circuit includes a plurality of programmable ICs mounted on the routing layer and inter-coupled by the routing circuitry of the interposer. One of the programmable ICs is a master programmable IC and others of the programmable ICs are slave programmable ICs. The master programmable IC is configured to transmit a received configuration data sequence to the slave programmable ICs in response to control bits in the configuration data sequence. The master programmable IC and the slave programmable ICs are configured to program respective resources in parallel with configuration bits from the configuration data sequence.

In another embodiment, a method is provided for testing a plurality of programmable integrated circuits (ICs) mounted on and inter-coupled by an interposer. Programmable resources of each of the programmable ICs are configured to implement a test circuit specified by a configuration data sequence. The test circuit includes one or more outputs. At each of the programmable ICs, the test circuit is operated and a respective deterministic number sequence is generated from the one or more outputs of the test circuit. The deterministic number sequences are output from the plurality of programmable ICs. An expected value is determined from the deterministic number sequences. Each of the deterministic number sequences are compared to the expected value to determine if the corresponding programmable IC is operating correctly.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Figure 1:
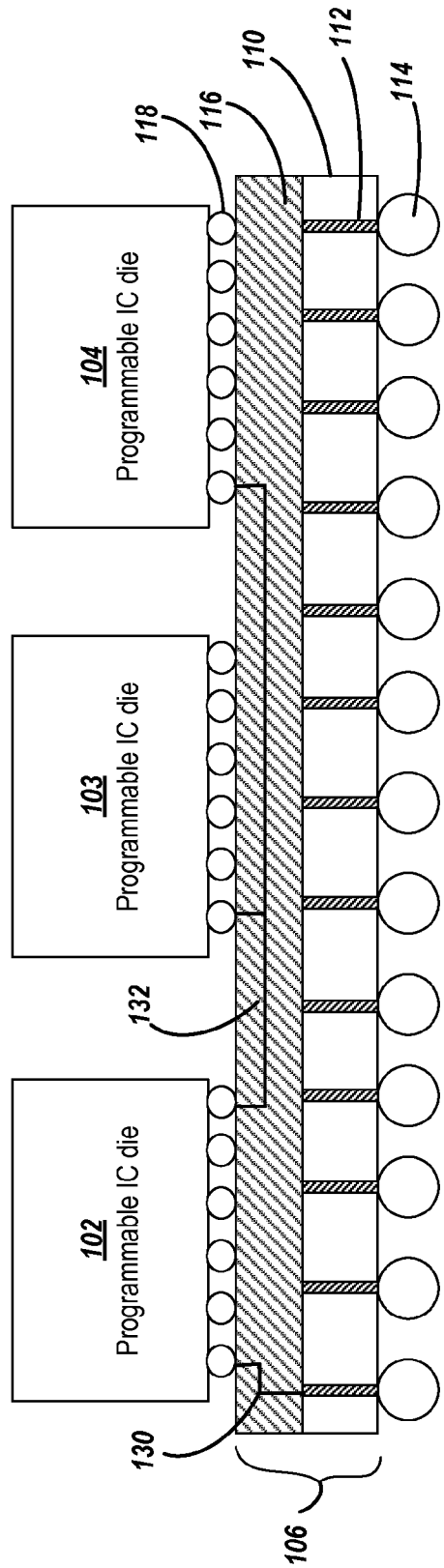
FIG. 1 shows a cross-sectional side view of a multiple-die IC having a plurality of interconnected programmable IC dies.

Importantly, verifying logic externally by probing the external pins has become increasingly difficult in certain scenarios. For instance, flip-chip and ball grid array (BGA) packaging may not have exposed leads that can be physically probed using external tools such as an oscilloscope. Using traditional methods, capturing signal states on devices running at system speeds in excess of 200 MHz can be challenging. Furthermore, most circuit boards are small and have multiple layers of epoxy, with lines buried deep within the epoxy layers. These lines are inaccessible using an external tool. Notably, attaching headers to sockets or SoCs to aid in debugging can have adverse effects on system timing, especially in the case of a high-speed bus. In addition, attaching headers can consume valuable printed circuit board (PCB) real estate.

One embodiment relates to configuration and testing of an IC that has multiple dies interconnected together. For instance, a multiple-die IC may be implemented using a plurality of programmable ICs that are interconnected by circuitry on a substrate or interposer. Following assembly of such a multiple-die IC, each programmable IC must be tested to verify its functionality. Such verification involves configuring each of the programmable ICs with various configuration data and/or input sequences that test different programmable resources under different input scenarios.

Programmable ICs may be implemented using a monolithic architecture, where an entire circuit design is implemented using programmable resources of a single programmable IC. In such an architecture, configuration and/or testing of a circuit design is performed by configuring the entire programmable IC with a large configuration data sequence made for that specific device. The large configuration data sequence is sometimes referred to as a configuration bitstream. The large configuration data sequence is used to program the programmable resources of the IC. Multiple-die ICs have been configured and verified in a similar manner. One large configuration data sequence is constructed that includes configuration data for each individual one of the programmable IC dies. As each portion of the configuration data sequence is received, a controller determines a programmable IC that is to be programmed by the portion and forwards the sequence to the determined IC. In this manner, the programmable ICs are sequentially configured. However, during testing/verification of a multiple-die IC, each programmable IC is configured with a similar set of test data. In this application, the sequential configuration of the multiple programmable IC is slow. Furthermore, as a multiple-die IC may contain a large number of programmable ICs and verification may require a large number of different configurations for each programmable IC, the sequential configuration method may be infeasible.

In some implementations, the disclosed method and system reduce the time required for configuration and testing of programmable IC dies in a multiple-die architecture by configuring the programmable IC dies (with identical configuration data sequences) in parallel. One of the programmable IC dies is configured or designated to operate as a master IC and the other programmable IC dies are configured to operate as slave ICs. During configuration of test circuits in the programmable IC dies, the master programmable IC die receives a configuration data sequence, and in response, uses the configuration data sequence to configure each of the slave programmable IC dies in parallel. As the configuration data is received, the master programmable IC die programs its configuration memory and forwards the configuration data to the slave programmable IC dies. For instance, in one implementation the master programmable IC die may broadcast configuration data to the slave programmable IC dies over a data bus. Input test data vectors (if not included in the configuration data sequence) may be similarly received by inputs of the master IC and forwarded in parallel to inputs of each programmable IC die. Alternatively, the package circuitry interconnecting the master and slave programmable ICs may temporarily connect one or more inputs of master and slave programmable IC dies together during testing, so that test vectors may be propagated to the respective inputs.

In some applications, output results generated by each of the master and slave programmable IC dies may not be easily output from the multiple-die architecture. This is because the configuration data sequence may configure each of the programmable IC dies to use the same terminals as outputs. However, not all of the programmable IC dies have the same input/output pads bonded to input/output terminals of the interposer/package. To address this scenario, the outputs of each of the programmable IC dies are monitored and converted into a respective deterministic value that may be output on a serial data line.

FIG. 1 shows a cross-sectional side view of a multiple-die IC. The multiple-die IC in this example includes a plurality of programmable IC dies (e.g., 102, 103, and 104) mounted on and interconnected by interposer 106. Interposer 106 can be implemented as a die formed of one or more layers of an IC process technology. Interposer 106 includes one or more wiring layers 116 (e.g., 130 and 132) to interconnect contacts (e.g., micro bumps 118) of the programmable IC dies and external contacts (e.g., 114) of the interposer. Interposer 106 may be configured as an entirely passive structure within which the inter-die wiring (e.g., 130 and 132) is implemented. Interposer 106 may include one or more active devices that can be dynamically configured to implement different wiring patterns in the wiring layer 116. The disclosure is not intended to be limited to either passive or active interposers.

In one or more implementations, programmable IC dies 102, 103, and 104 are disposed in the same horizontal plane on interposer 106, as shown in FIG. 1. However, in some implementations, dies may be oriented in a number of stacked layers. The programmable IC dies 102, 103, and 104 are coupled to interposer 106 through a plurality of micro bumps 118. Micro bumps 118 generally are solder balls that electrically couple pads (not shown) of each of dies to pads (not shown) of interposer 106. For example, during manufacture of a multiple-die IC, the bottom side of programmable IC dies 102, 103, and 104 may be micro-bumped. Similarly, the top side of interposer 106 may be configured with micro-bump pads. Programmable IC dies 102, 103, and 104 can be aligned on the top of interposer 106 so that each micro-bump of the programmable IC dies is aligned with a micro-bump pad on the interposer. Aligned micro-bump pairs between interposer 106 and dies 102, 103, and 104 can be interconnected to form a single electrical connection illustrated as micro-bumps 118.

Some micro bumps 118 are connected to solder bumps 114 by wiring layer 116 and silicon vias (TSVs) 112. Each TSV 112 can extend completely through interposer substrate 110 extending from a pad disposed immediately below the top surface of the substrate through to a pad exposed through the bottom surface of the substrate. Each TSV 112 can couple a pad of one of dies 102, 103, and 104, via a micro-bump 118, for example, to one of the plurality of solder bumps 114. Solder bumps 114, also referred to as "C4 bumps," generally are solder balls that couple pads on the bottom portion of an interposer to external terminals of the multiple-die IC package. One or more pads of dies 102, 103, and 104 can be coupled to external pins of the package of multiple-die IC 100 by coupling the pads to micro bumps 118, to TSVs 112, to package bumps 114, and to external package pins.

Figure 2:
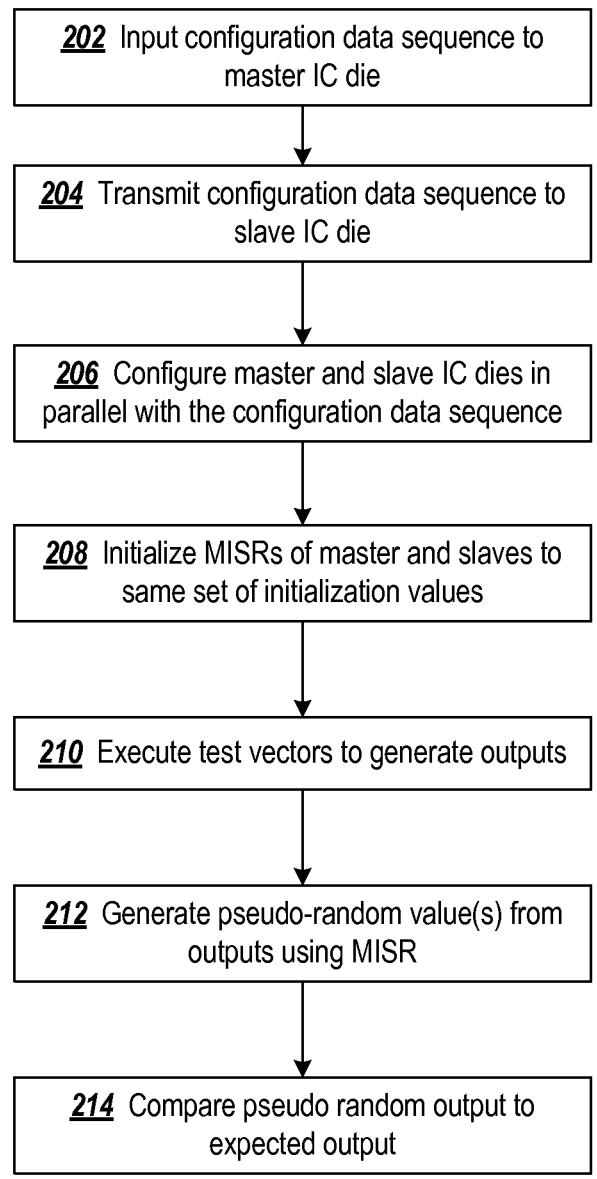
FIG. 2 shows a flowchart of a process for configuration and testing of a plurality of programmable IC dies of a multiple-die IC.

FIG. 2 shows a flowchart of a process for configuration and testing of a plurality of programmable IC dies of a multiple-die IC. A configuration data sequence is input to a configuration input of the master programmable IC die at block 202. The master programmable IC die forwards the configuration data sequence to each of the slave programmable IC dies in parallel at block 204. Master and slave programmable IC dies are configured in parallel with the configuration data at block 206.

As indicated above, output pads of different programmable IC dies may be configured differently in a particular application. For instance, there may not be enough I/O pins on a package to connect to each I/O pin of the programmable IC dies. As one example, the routing layer of an interposer may connect the pad on one programmable IC die to an output pad of the package and not connect the corresponding pad of another one of the programmable IC dies. To test such a structure, a circuit is implemented in each programmable IC die to monitor the outputs and generate a deterministic data value (e.g., a hash value) based on the output data values. The generated deterministic values may be output and compared to determine if the programmable IC dies are generating consistent outputs. If one of the programmable IC dies is generating different output values, due to error, the generated hash value will be different from the generated hash values output from the other programmable IC dies. Use of the deterministic value for comparison reduces the amount of data that must be output. The deterministic data generated by each of the programmable IC dies may be output using a serial output interface, such as JTAG.

Referring again to FIG. 2, each programmable IC die implements a multiple-input-shift-register (MISR) to convert output data into a deterministic data value. The MISRs for master and slaves are initialized to the same set of initialization values at block 208. After initialization, a set of test vectors are executed by each of the programmable IC dies at block 210 to test the desired circuits and generate outputs. Input test vectors may be included in the configuration data sequence or may be received following configuration of programmable resources. If input test vectors are not included with the configuration data sequence, the test vectors are received by the master programmable IC die and forwarded to slave programmable IC dies in the same manner as the configuration data sequence. Deterministic data values are generated from the output data by the MISR circuit in each FPGA at block 212. In some implementations the generated deterministic values are generated pseudo-randomly based on the input. As such, differences in the outputs generated by the logic circuits will cause pseudo-random differences to appear between the deterministic data values. The deterministic data values are output and compared at block 214 to determine whether any of the FPGAs produces inconsistent results in execution of the test data.

Master and slave programmable IC dies may be designated using a number of different methods. Referring again to FIG. 1, one or more micro-bumps 118 may be used to specify aspects of multiple-die IC such as the number of dies included within multiple-die IC and which die is designated as the master die and which die (or dies) is designated as the slave die. For example, during the manufacturing process, one or more of micro-bumps 118 for each of dies 102, 103, and 104 can be reserved to specify the information noted. The reserved micro-bumps, e.g., each individual one of the reserved micro-bumps, can be either coupled to ground or left floating. When coupled to ground, the reserved micro-bumps remain at the voltage potential of ground, e.g., a logic low. When the reserved micro-bumps are left floating, pull-up circuitry coupled to the reserved micro-bumps 118 can pull the voltage high, e.g., indicating a logic high. One reserved micro-bump 118 can be used to indicate whether the programmable IC die is a master or a slave. A controller or other circuitry, e.g., a configuration controller, within each die can determine whether that die is a master or a slave based upon whether the enumerated and reserved micro-bump 118 of that die is high or low. In this manner, the designation of one die as master and each other die as a slave can be implemented during the manufacturing process through proper coding, e.g., coupling of the reserved micro-bumps 118 in each respective die. This process allows identical dies to be included within multiple-die IC 100 since designation of one die as master and another die as slave can occur during packaging purely through the encoding described as opposed to when each die is manufactured. The micro-bump encoding process means that master dies can be identical to slave dies when manufactured.

Figure 3:
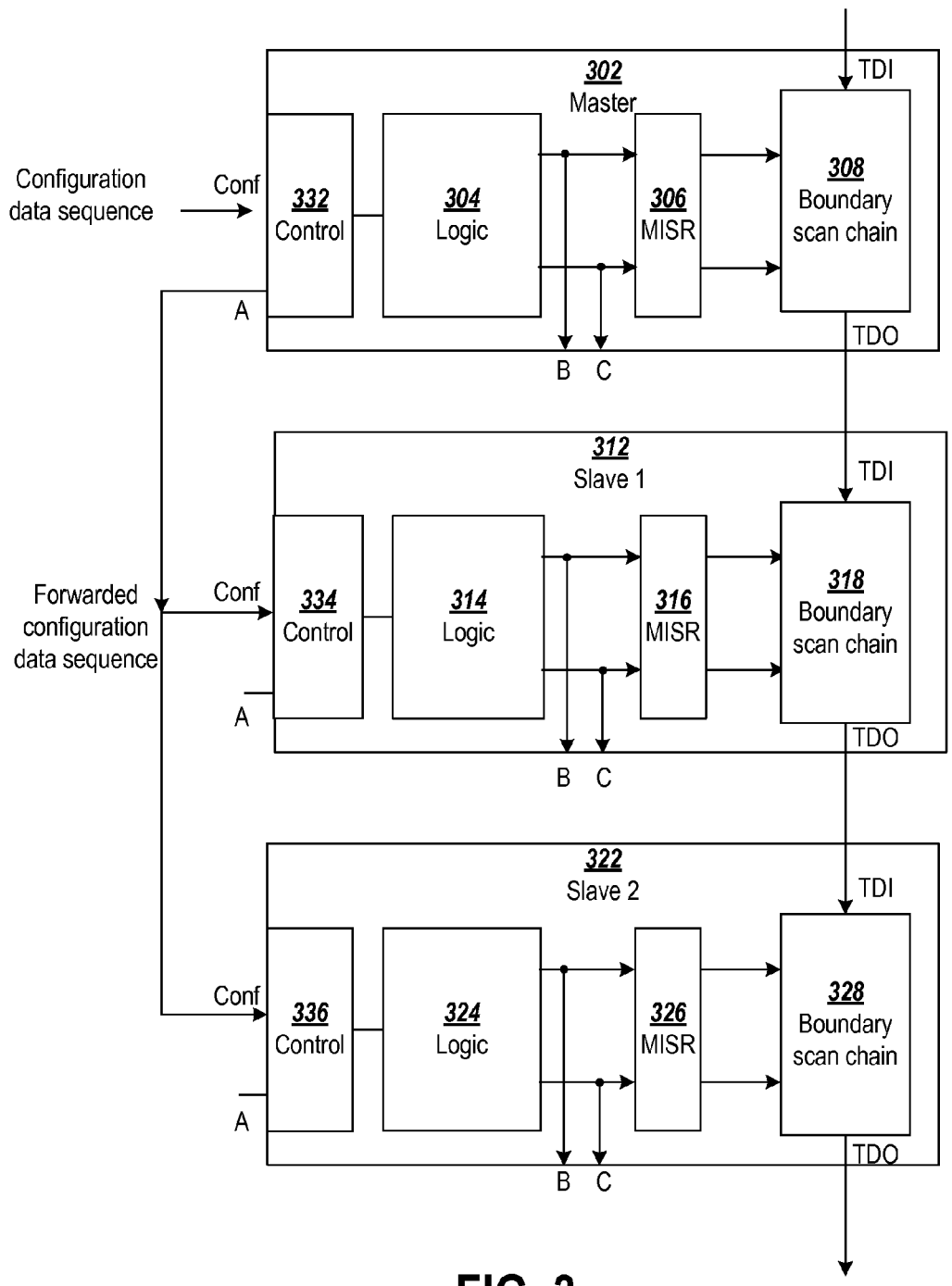
FIG. 3 shows a plurality of programmable IC dies coupled together in a master-slave arrangement for configuration of slave cells in parallel.

FIG. 3 shows a plurality of programmable IC dies connected together in a master-slave arrangement for parallel configuration and verification testing. In this example, each master programmable IC die 302 and slave programmable IC die (e.g., 312 and 322) includes a configuration port (Conf) and a number of I/O ports (A-C). As discussed above, the master and slave programmable IC dies (e.g., 302, 312, and 322) are configured to receive a configuration data sequence via a respective Conf port and configure respective programmable resources to implement respective test circuitry (e.g., 304, 314, and 324) specified by the configuration data sequence. The master programmable IC 302 is configured to use an I/O port B to forward the received configuration data sequence to the Conf port of each of the slave programmable IC dies (e.g., 312 and 322). In this manner, the slave programmable IC dies may be configured with a configuration data sequence for testing in parallel. In this example, the configuration of programmable resources of each programmable IC is controlled by a respective configuration control circuit (e.g., 332, 334, and 336). Each configuration control circuit is configured to program programmable resources of the programmable IC using a received configuration data sequence and forward the data sequence if the programmable IC is designated to be a master programmable IC. Otherwise, if the programmable IC is designated to be a slave programmable IC, the control circuit does not forward the configuration data sequence. As discussed with reference to FIG. 2, micro-bumps may be reserved to indicate whether a programmable IC is a master or a slave based on the voltage status of the micro-bump. For instance, the micro-bump may be coupled to ground to indicate the programmable IC is a master or left floating to indicate that it is a slave.

As discussed above, the common configuration data sequence configures the I/O ports (e.g., A-C) of the master and slave programmable IC dies to operate in a similar manner. However, the actual design to be implemented using the multiple-die architecture may connect I/O ports of different slave circuits differently. For instance, routing circuitry of an interposer package may connect I/O port C of slave cell 1 to an I/O terminal of the package but connect I/O port C of slave cell 2 to a path that is not externally accessible. Furthermore, there may not be enough package terminals to connect each I/O terminal of the master and slave programmable ICs to a respective terminal of the package.

Each of the master and slave programmable IC dies (e.g., 302, 312, and 322) may include a circuit (e.g., MISRs 306, 316, and 326) that is configured to generate a deterministic data value based on output of one or more I/O ports (e.g., B and C) of the programmable IC dies. As discussed with reference to FIG. 2, the generated deterministic values may be output and compared to determine if the programmable IC dies are generating consistent outputs. If one of the programmable IC dies is generating different output values, such as due to error, the generated hash value from the one programmable IC die will be different from the hash values generated by the other programmable IC dies. Use of the deterministic value for comparison reduces the amount of data that must be output. In the implementation shown in FIG. 3, deterministic data values are generated in each programmable IC using respective MISRs to generate a deterministic pseudo-random number. However, it is recognized that deterministic data values may be implemented with a number of other circuits as well.

The deterministic data values may be output from the master and slave programmable IC dies to determine whether any of the programmable IC dies produce inconsistent results in response to the input data values. Deterministic data values may be output from the IC package and compared by an external analysis circuit to determine whether any of the master or slave programmable IC dies are producing inconsistent output signals. Alternatively, data values may be compared by an analysis circuit (not shown in FIG. 3) implemented within the package. The deterministic data values of different programmable IC dies may be compared to determine an expected value. The expected value may be determined by a majority voter circuit that compares the values of the different programmable IC dies to determine a value that is output by a majority of the programmable IC dies. A programmable IC die outputting a deterministic value different from the expected value (i.e., the majority value) is determined to be operating incorrectly.

The deterministic data generated by each of the programmable ICs may be output using a serial output interface, such as a boundary scan interface. Boundary scan interfaces may provide embedded test circuits, such as test access ports (TAPs), at chip level to debug, verify, and test PCB assemblies. The institute of electronic engineers (IEEE) joint test action group (JTAG) has defined a standard, JTAG TAP also known as IEEE 1149.1, that utilizes boundary-scan for debugging and verifying PCB assemblies, such as SoCs. IEEE Standard 1149.1 defines a four pin serial interface that drives a 16-state controller (state machine) formed in each compliant IC device. The four pins control transitions of the state machine and facilitate loading of instructions and data into the compliant IC device to accomplish pre-defined tasks. Originally, IEEE Standard 1149.1 was developed to perform boundary scan test procedures wherein the interconnections and IC device placement on printed circuit boards (PCBs) are tested through the connection pins of the PCBs (i.e., without the need for a mechanical probe). Since its establishment, some implementations of boundary scan have been extended to include additional test procedures such as device functional tests, self-tests, and diagnostics.

In the example implementation shown in FIG. 3, a JTAG boundary scan chain (e.g., 308, 318, and 328) is included in each master and slave programmable IC. Each output of a MISR circuit is connected to a respective output register of the JTAG circuit. The test-data-in (TDI) and test-data-out (TDO) terminals of the JTAG boundary scan chain (e.g., 308, 318, and 328) are connected together in series to form a boundary scan chain. The JTAG boundary scan chains serially output the deterministic data values from the IC package. In an alternative implementation (not depicted), a single JTAG boundary scan chain is disposed within the IC package but external to the master and slave circuits. In one such implementation, the output pins of each master/slave programmable IC are routed to respective input taps of the JTAG boundary scan interface.

Figure 4:
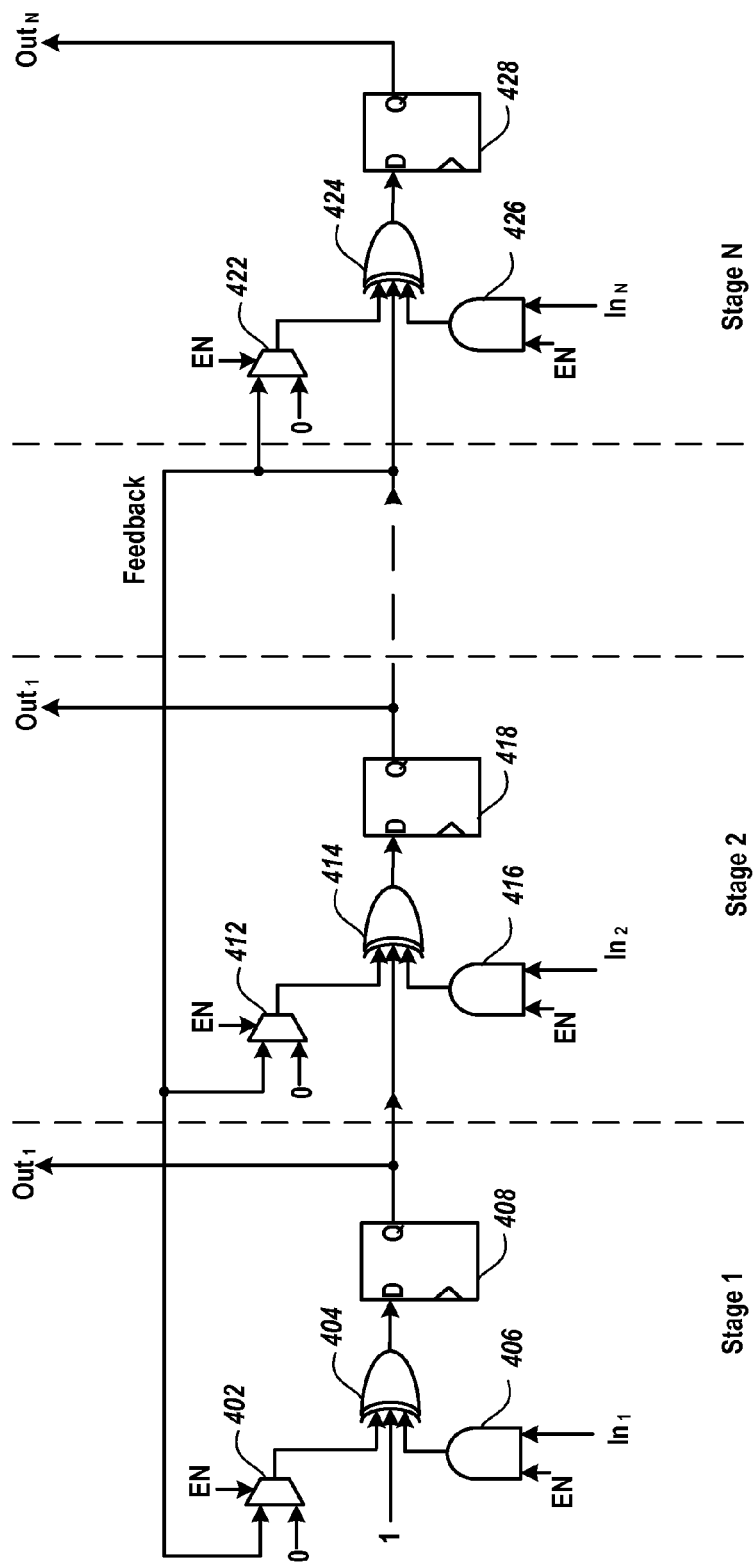
FIG. 4 shows a block circuit diagram of a multiple-input-shift-register circuit that may be used to generate a deterministic data output from output data values.

FIG. 4 shows a block circuit diagram of a MISR circuit that may be used to generate deterministic data values from output data values of a programmable IC. The MISR is a linear feedback shift register whose register values are altered in a unique way each cycle by its inputs ($IN_1$ through $IN_N$) and a feedback value. In this example, an N stage MISR is implemented. In each stage, inputs (e.g., $IN_1$ through $IN_N$, and the feedback signal) are enabled or disabled with a respective AND gate (e.g., 406, 416, and 426) and MUX gate (e.g., 402, 412, and 422). Enabled signals are XOR'd by a respective XOR gate (e.g., 404, 414, and 424) and the resulting value is stored in a respective flip-flop (e.g., 408, 418, and 428). In this example, the output data value from the flip-flop of stage N-1 is used as the feedback data value to each of the stages. However, other feedback implementations are possible as well. For instance, in one alternative implementation output data values from stage N may be used as feedback for even numbered stages (e.g., 2, 4, 6 . . . ) and output from stage N-1 may be used for feedback to odd numbered stages (e.g. 1, 3, 5 . . . ).

If the MISR is left running for a substantial number of cycles, its output will be uniquely determined by the data values input during this period. If there is a single bit wrong in any cycle, the output signature of the MISR will be completely different due to the pseudo-random nature of the deterministic values. By using the MISR to observe the outputs of the programmable IC, direct at-speed observation of the outputs on the tester is not necessary for verification. This reduces speed requirements of automatic test equipment and decreases testing runtime requirements. In some implementations, phase locked loops (PLL) of a programmable IC may be clocked at a higher rate than external test circuits used to compare data values.

Figure 5:
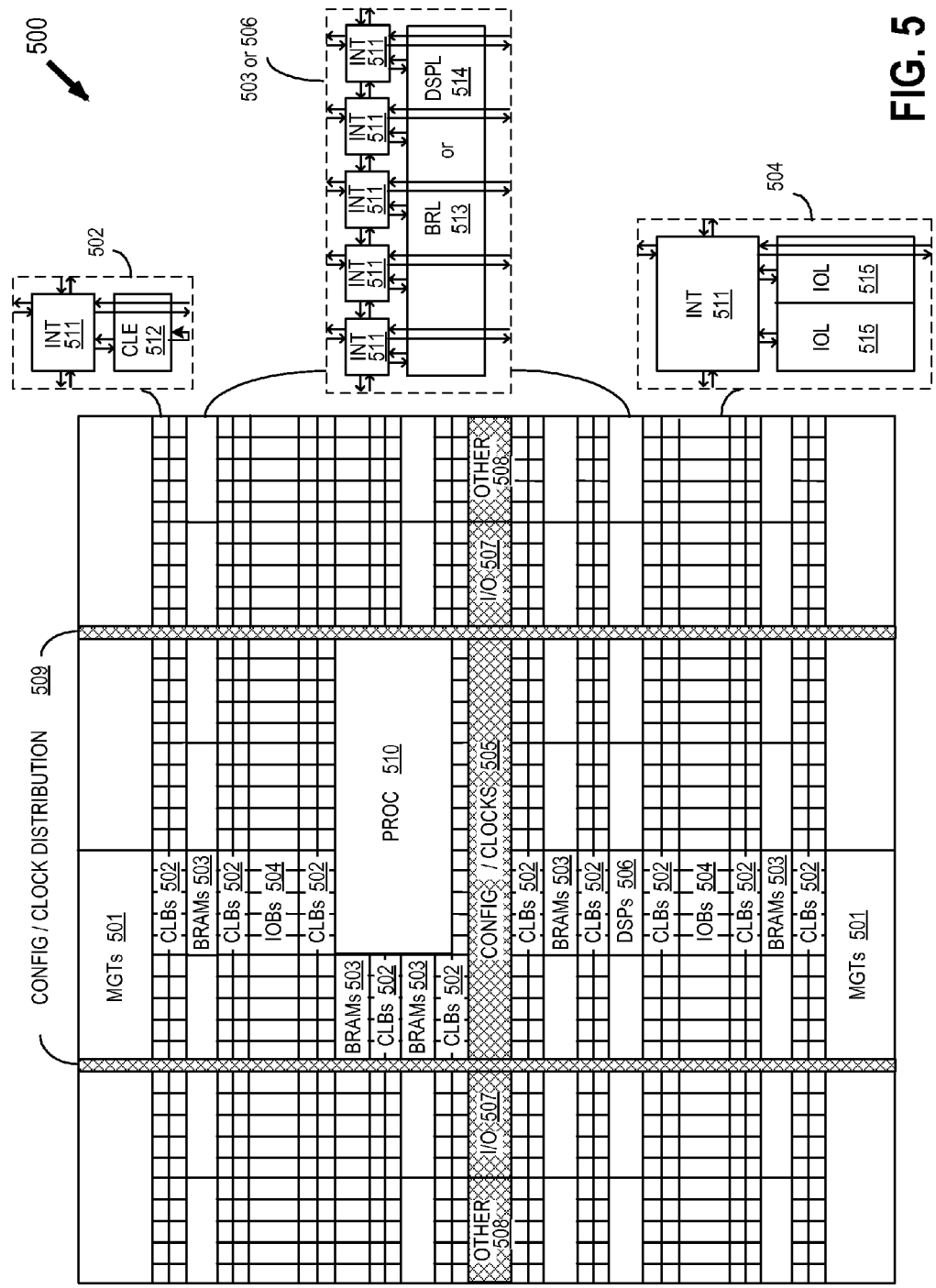
FIG. 5 is a block diagram of an example programmable logic integrated circuit that may be implemented as a die in a multiple-die IC.

FIG. 5 is a block diagram of an example programmable logic integrated circuit that may be implemented as a die in a multiple-die IC. A multiple-die IC, as previously described, may be implemented using a plurality of programmable ICs, such as a field programmable gate array (FPGA), interconnected on an interposer.

FPGAs can include several different types of programmable logic blocks in the array. For example, FIG. 5 illustrates an FPGA architecture (500) that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507), for example, e.g., clock ports, and other programmable logic 508 such as digital clock managers, analog-to-digital converters, system monitoring logic, and so forth. Some FPGAs also include dedicated processor blocks (PROC 510) and internal and external reconfiguration ports (not shown).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element INT 511. A BRAM 503 can include a BRAM logic element (BRL 513) in addition to one or more programmable interconnect elements. Typically, the number of interconnect elements included in a tile depends on the height of the tile. In the pictured FPGA, a BRAM tile has the same height as five CLBs, but other numbers (e.g., four) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element INT 511. As will be clear to those of skill in the art, the actual I/O pads connected, for example, to the I/O logic element 515 are manufactured using metal layered above the various illustrated logic blocks, and typically are not confined to the area of the input/output logic element 515.

In the pictured FPGA, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Although some of the embodiments and examples are described with reference to FPGAs, those skilled in the art will appreciate that the embodiments may be applied to multiple-die ICs using other core architectures as well. FPGAs are merely used herein as exemplary ICs to which the embodiments can be applied. However, the embodiments are not so limited, and the teachings can be applied to other programmable ICs. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the disclosure being indicated by the following claims.

What is claimed is:

1. A method of operating a circuit, comprising:
   inputting a configuration data sequence to a first programmable integrated circuit (IC);
   determining by a configuration control circuit in the first programmable IC whether the first programmable IC is a master programmable IC or a slave programmable IC based on a voltage status of a micro-bump of the first programmable IC; and
   in response to the configuration control circuit in the first programmable IC determining the first programmable IC is a master programmable IC and control bits in the configuration data sequence:
      transmitting the configuration data sequence from the master programmable IC to one or more slave programmable ICs; and
      configuring the master programmable IC and the one or more slave programmable ICs in parallel with configuration bits from the configuration data sequence.

2. The method of claim 1, further comprising:
   at each programmable IC of the master and slave programmable ICs, in response to control bits in the configuration data sequence, configuring programmable resources of the programmable IC to implement a logic circuit having one or more outputs; and
   generating a deterministic number sequence from the one or more outputs of the logic circuit.

3. The method of claim 2, further comprising, at each programmable IC of the master and slave programmable ICs, in response to the control bits in the configuration data sequence, further configuring programmable resources of the programmable IC to implement a multiple-input shift register (MISR) circuit having a respective input tap for each of the one or more outputs of the logic circuit, the MISR circuit configured to generate the deterministic number sequence from the one or more outputs.

4. The method of claim 3, further comprising initializing the respective MISR circuits to an equal value.

5. The method of claim 3, generating respective deterministic number sequences using the respective MISR circuits in response to the one or more outputs of the respective logic circuits for a plurality of data cycles, in which data values are output from the one or more outputs of the respective logic circuits in each of the plurality of data cycles.

6. The method of claim 5, further comprising, after the plurality of data cycles:
   outputting a current value of the deterministic number sequence from each of the respective programmable ICs; and
   comparing each of the current values to an expected value to determine if the corresponding programmable IC is operating correctly.

7. The method of claim 6, wherein the outputting of the current value of the deterministic number sequence includes outputting the current value of the deterministic number sequence using a serial input/output interface.

8. The method of claim 7, wherein the serial input/output interface is a JTAG boundary scan interface.

9. The method of claim 6, further comprising determining the expected value by comparing the current values of the deterministic number sequences to determine a value of a majority of the current values of the deterministic number sequences.

10. A circuit, comprising:
    an interposer that includes:
       a substrate;
       a plurality of through-silicon-vias (TSVs) extending through the substrate; and
       a routing layer that includes routing circuitry coupled to the plurality of TSVs; and
    a plurality of programmable integrated circuits (ICs) mounted on the routing layer and inter-coupled by the routing circuitry of the interposer; and
    wherein each of the programmable ICs includes a configuration control circuit coupled to a reserved micro-bump of the programmable IC and a voltage status of the reserved micro-bump indicates whether the programmable IC is a master programmable IC or a slave programmable IC, and the configuration control circuit is configured and arranged, responsive to the voltage status of the reserved micro-bump indicating the programmable IC is a master programmable IC, to transmit a received configuration data sequence to each slave programmable IC in response to control bits in the configuration data sequence, and the master programmable IC and each slave programmable IC are configured to program respective resources in parallel with configuration bits from the configuration data sequence.

11. The circuit of claim 10, wherein each of the master and slave programmable ICs includes a circuit configured to generate a deterministic number from one or more outputs of a logic circuit implemented in the respective resources in response to the configuration data sequence.

12. The circuit of claim 11, wherein the circuit configured to generate the deterministic number is a multiple-input shift register (MISR) circuit having a respective input tap for each of the one or more outputs of the logic circuit.

13. The circuit of claim 12, wherein the MISR circuit of each of the master and slave programmable ICs are initialized, in response to the configuration data sequence, to values that are the same.

14. The circuit of claim 12, further comprising in each of the master and slave programmable ICs, a respective boundary scan interface circuit having one or more inputs connected to one or more outputs of the MISR circuit and configured to output the deterministic numbers generated by the MISR circuit on a serial data line.

15. The circuit of claim 12, wherein the boundary scan interface circuit is a JTAG interface.

16. A method of testing a plurality of programmable integrated circuits (ICs) mounted on and inter-coupled by an interposer, comprising:
   inputting a configuration data sequence to a first programmable IC of the plurality of programmable ICs;
   determining by a configuration control circuit in the first programmable IC whether the first programmable IC is a master programmable IC or a slave programmable IC based on a voltage status of a micro-bump of the first programmable IC;
   in response to the configuration control circuit in the first programmable IC determining the first programmable IC is a master programmable IC and control bits in the configuration data sequence:
      transmitting the configuration data sequence from the master programmable IC to one or more slave programmable ICs of the plurality of programmable ICs; and
      configuring programmable resources of the master programmable IC and the one or more slave programmable ICs in parallel to implement a test circuit specified by the configuration data sequence, the test circuit having one or more outputs;
   at each of the programmable ICs, operating the respective test circuit and generating a deterministic number sequence from the one or more outputs of the test circuit;
   outputting the deterministic number sequences from the plurality of programmable ICs;
   determining an expected value from the deterministic number sequences; and
   comparing each of the deterministic number sequences to the expected value to determine if the corresponding programmable IC is operating correctly.

17. The method of claim 16, further comprising, at each of the plurality of programmable ICs in response to control bits in the configuration data sequence, further configuring the programmable resources of each of the programmable ICs to implement a multiple-input shift register (MISR) circuit having a respective input tap for each of the one or more outputs of the test circuit, the MISR circuit configured to generate the deterministic number sequence from the one or more outputs.

18. The method of claim 17, further comprising initializing the respective MISR circuits to an equal value.

19. The method of claim 16, wherein:
   the outputting of the deterministic number sequences from the plurality of programmable ICs includes, at each of the plurality of programmable ICs, outputting the respective deterministic number sequence using a serial input/output interface.

* * * * *